United States Patent
Thio et al.

(10) Patent No.: US 6,670,227 B1
(45) Date of Patent: Dec. 30, 2003

(54) METHOD FOR FABRICATING DEVICES IN CORE AND PERIPHERY SEMICONDUCTOR REGIONS USING DUAL SPACERS

(75) Inventors: Hsiao-Han Thio, Sunnyvale, CA (US); Kei-Leong Ho, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/361,455

(22) Filed: Feb. 10, 2003

(51) Int. Cl.[7] .......................................... H01L 21/8238
(52) U.S. Cl. ........................................ 438/201; 438/258
(58) Field of Search .............................. 438/201, 211, 438/258, 275, 279, 305

(56) References Cited

U.S. PATENT DOCUMENTS 6,277,683 B1 * 8/2001 Pradeep et al. ............. 438/201
6,448,129 B1 * 9/2002 Cho et al. ................... 438/258
6,506,642 B1 * 1/2003 Luning et al. .............. 438/275
6,566,213 B2 * 5/2003 En et al. ..................... 438/305

* cited by examiner

Primary Examiner—Chandra Chaudhari
(74) Attorney, Agent, or Firm—Monica H. Choi

(57) ABSTRACT

For fabricating a first device within a core region and a second device within a periphery region, of a semiconductor substrate, disposable spacers having a first width are formed at sidewalls of a first gate stack of the core region and a second gate stack of the periphery region. Drain and source junctions of the second device are formed in the periphery region to the sides of the disposable spacers of the second gate stack. The disposable spacers are removed and permanent spacers having a second width are formed at the sidewalls of the first and second gate stacks, with the second width being less than the first width. Silicide is formed with an exposed portion of a drain bit line junction within the core region after forming the permanent spacers.

17 Claims, 12 Drawing Sheets

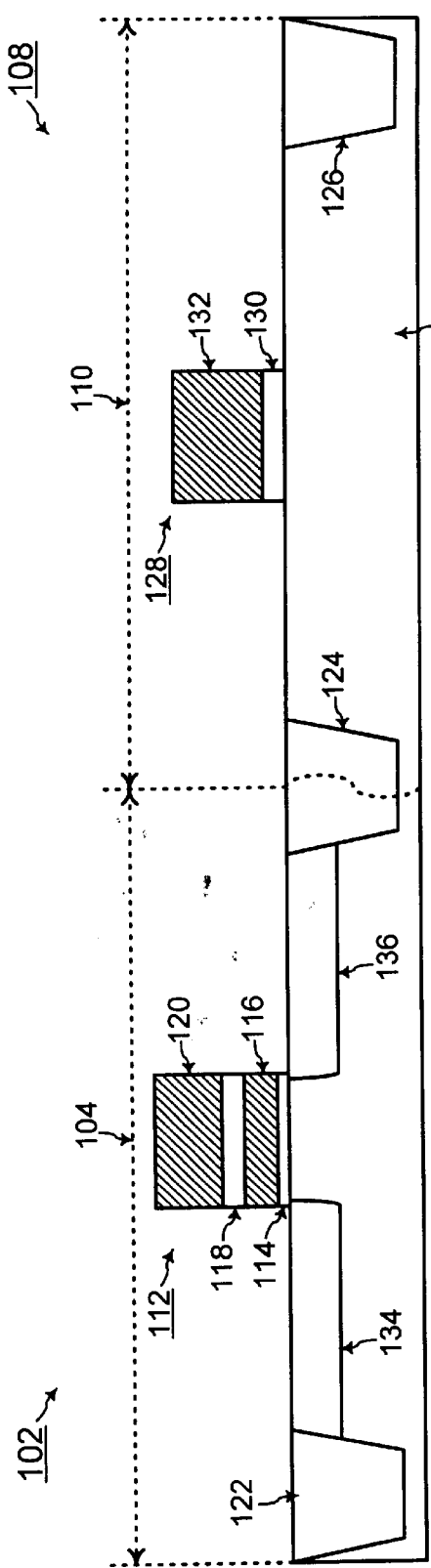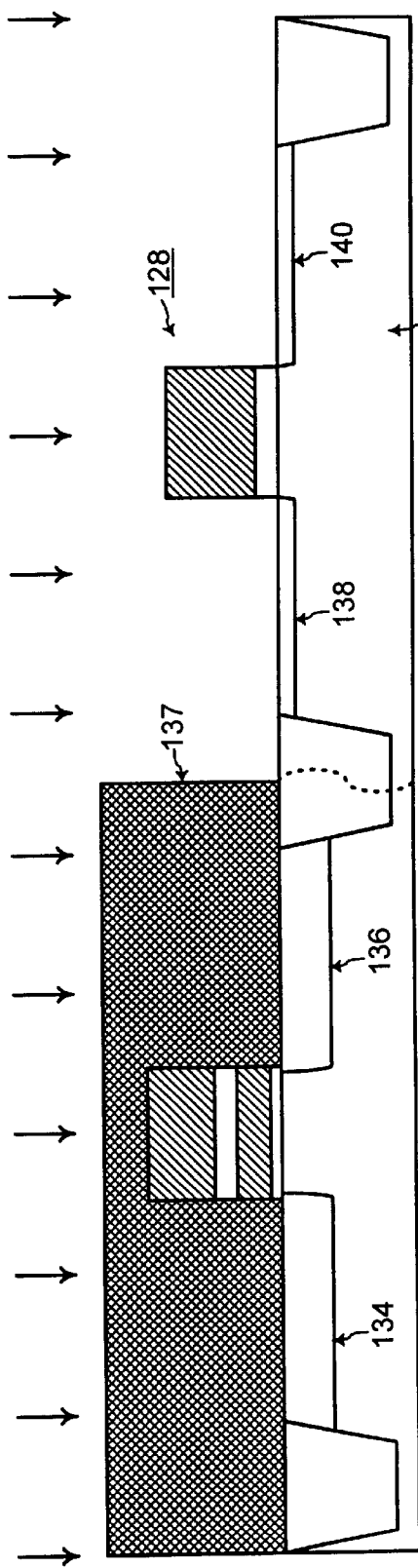
FIG. 1 (Prior Art)
FIG. 2 (Prior Art)

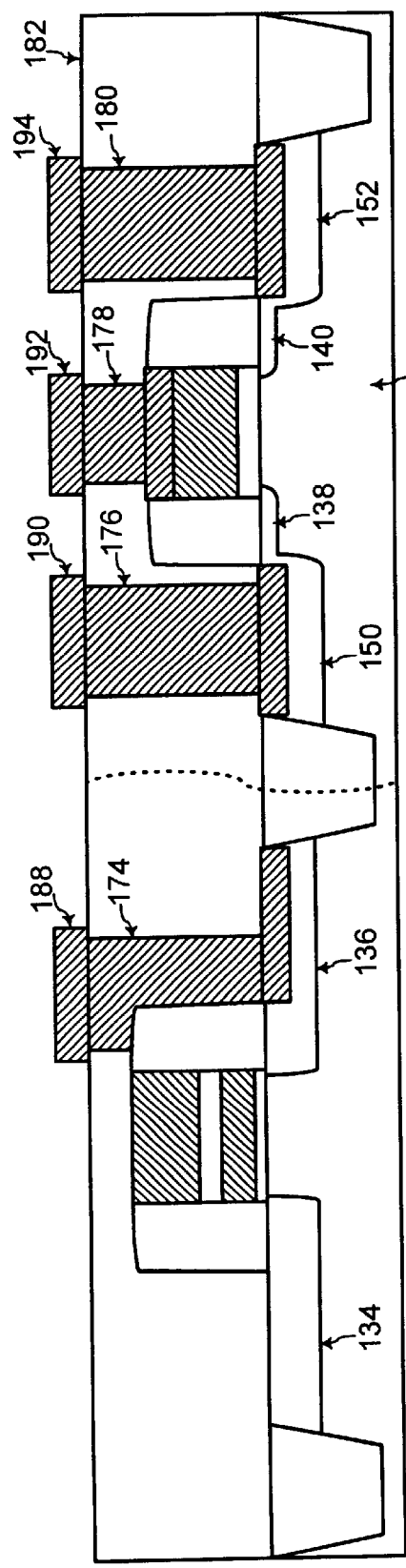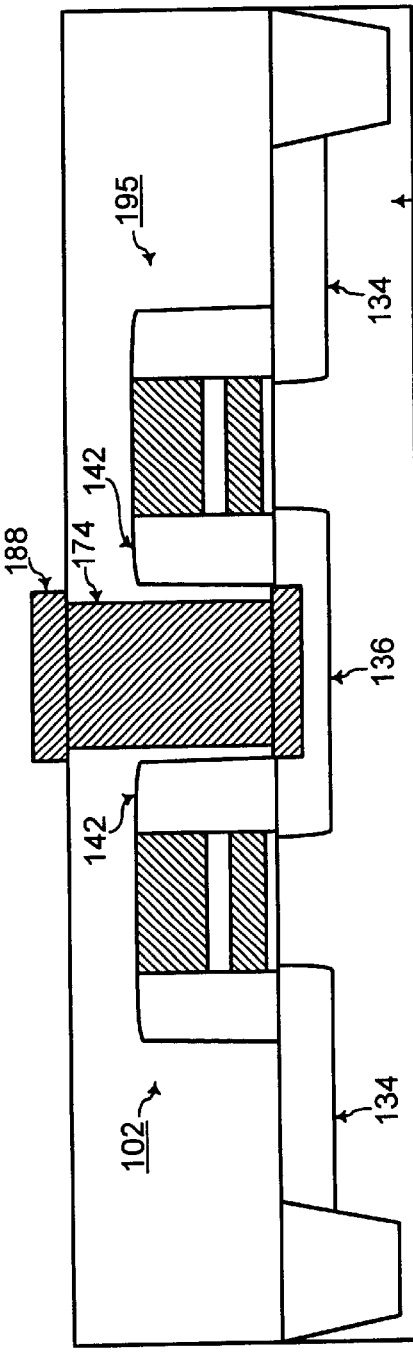

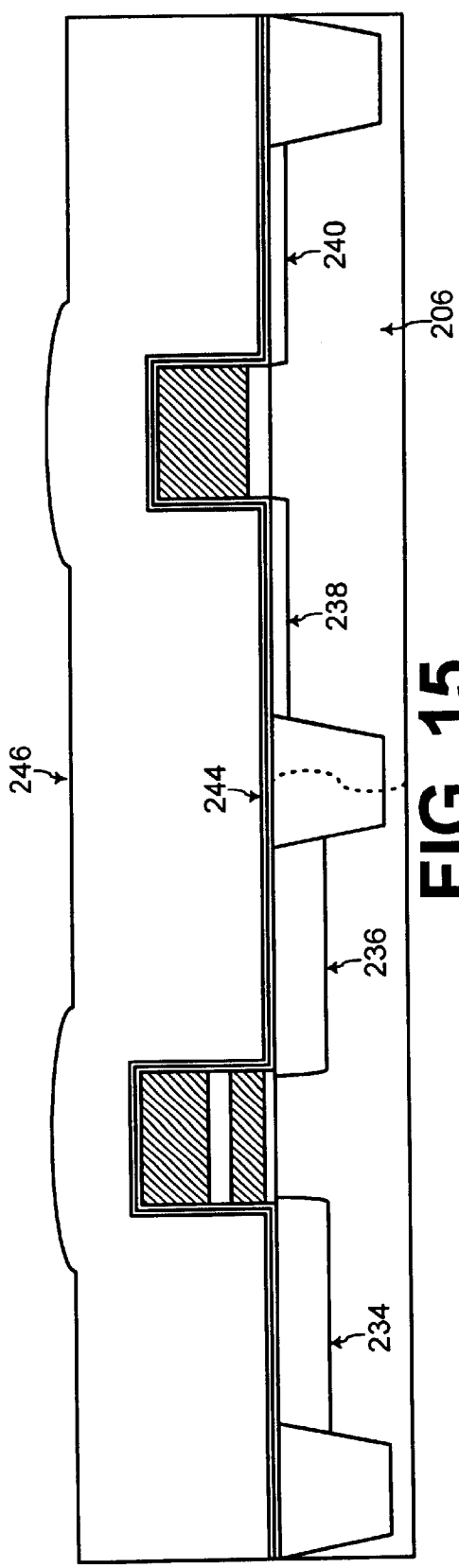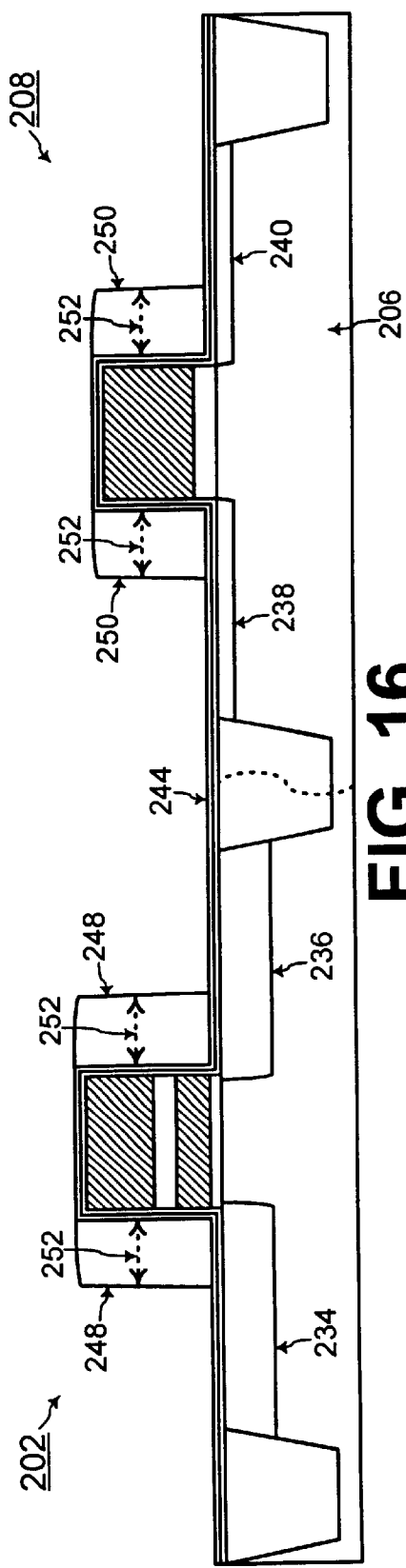

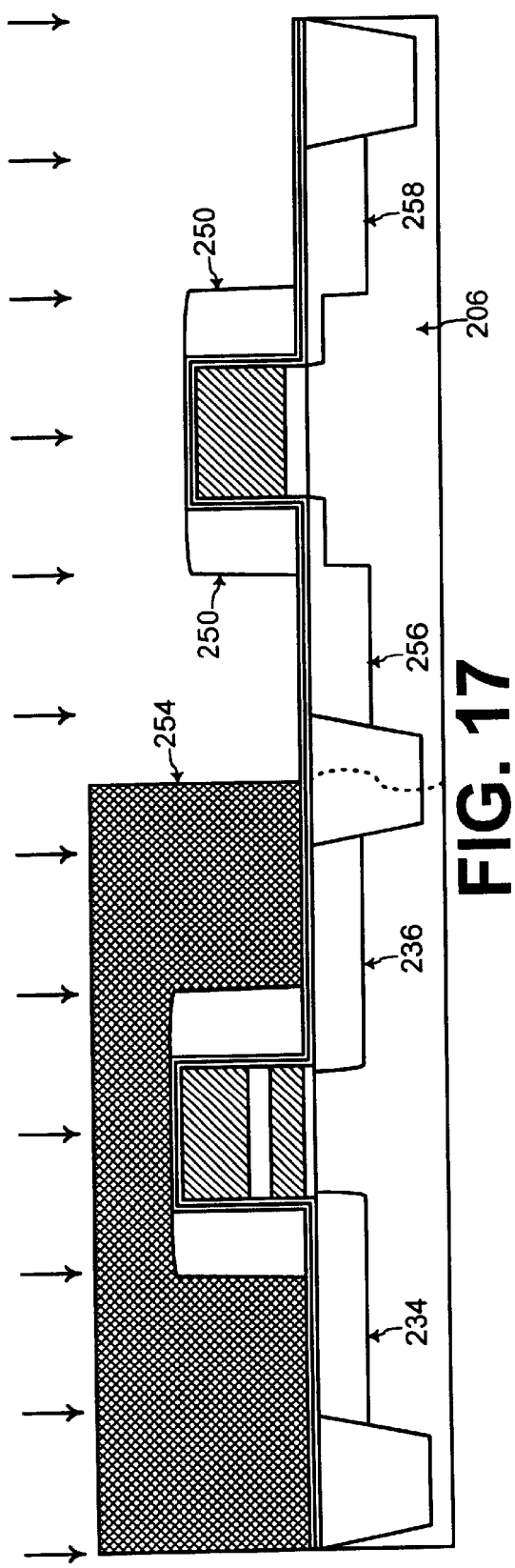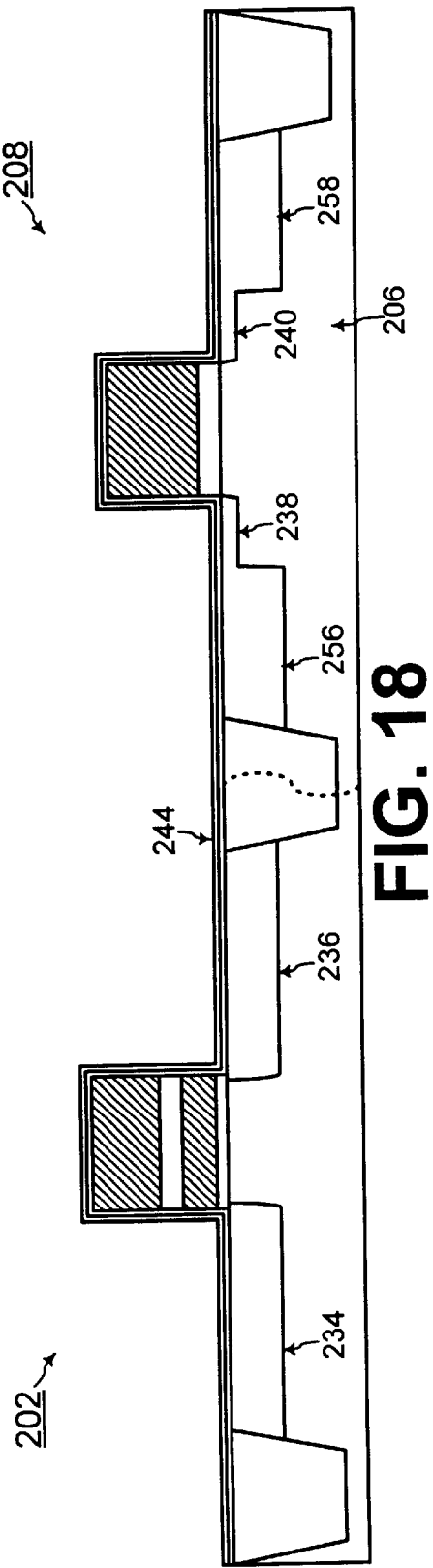

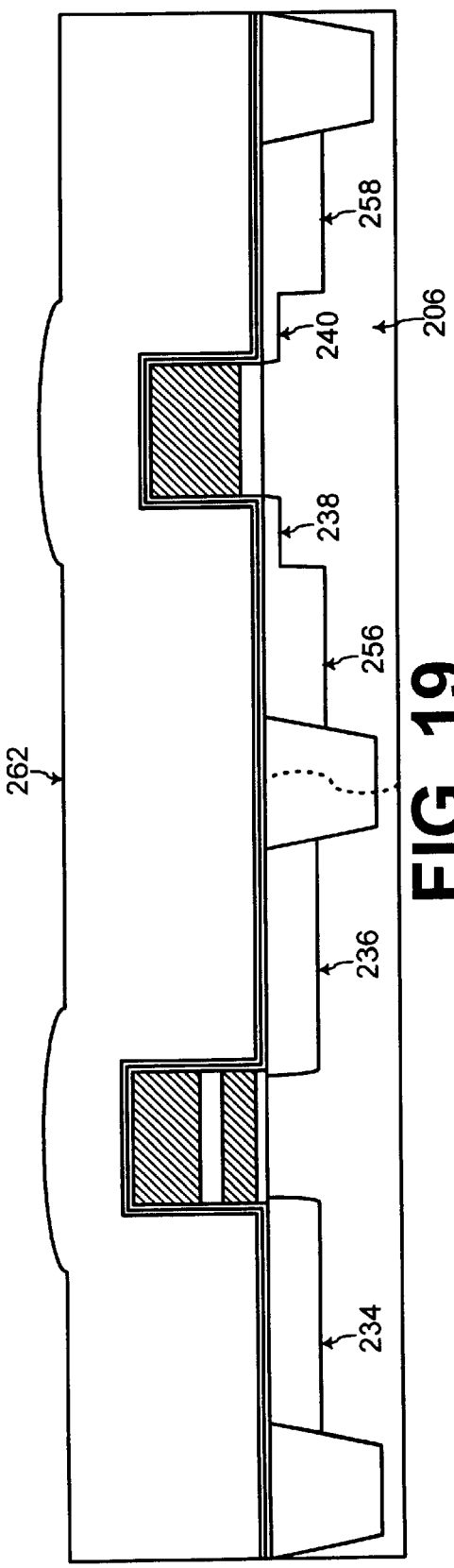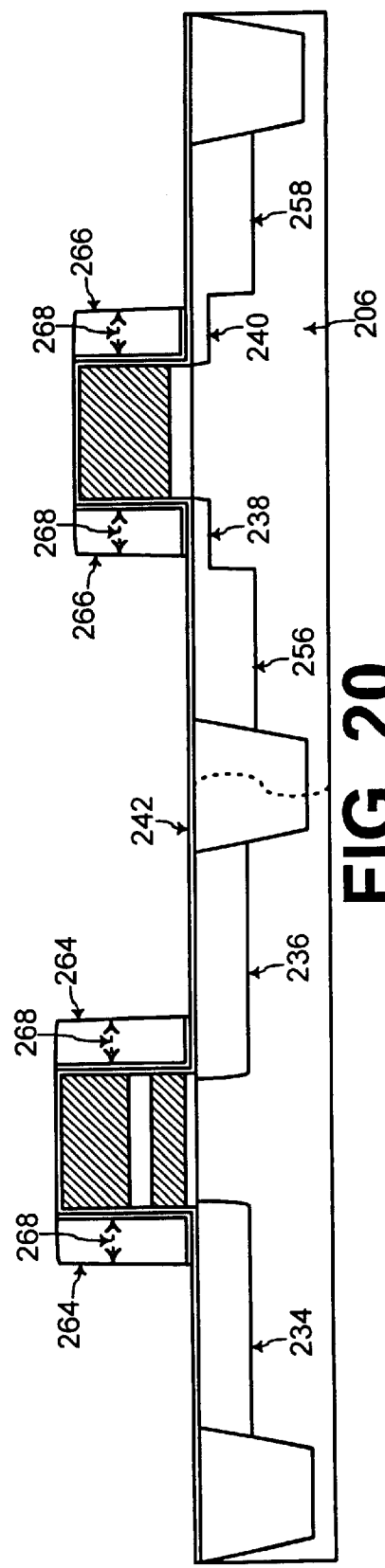

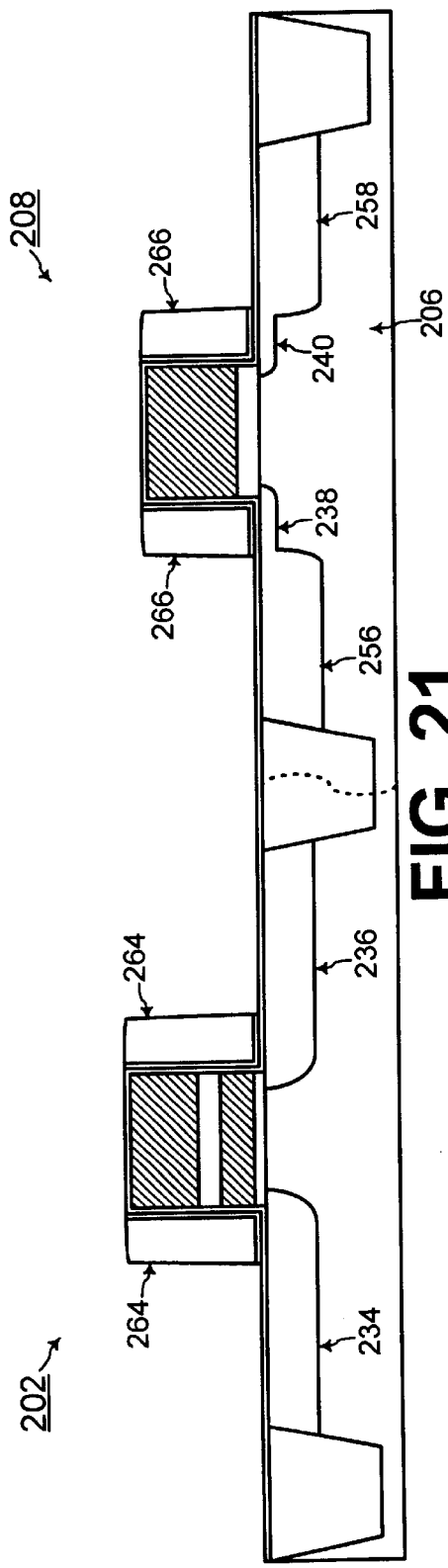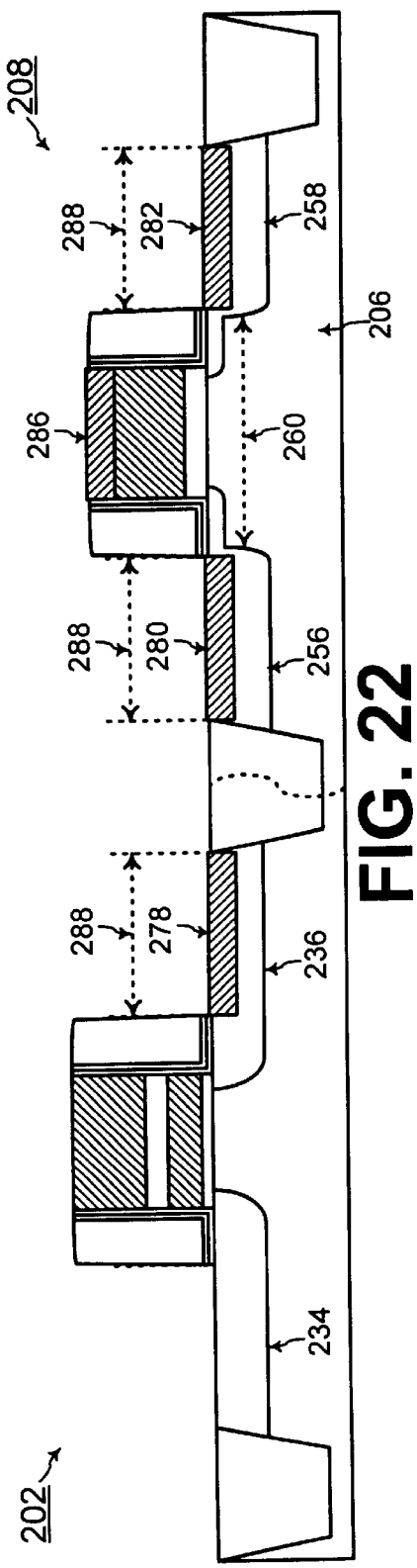

METHOD FOR FABRICATING DEVICES IN CORE AND PERIPHERY SEMICONDUCTOR REGIONS USING DUAL SPACERS

TECHNICAL FIELD

The present invention relates generally to integrated circuit fabrication, and more particularly, to a method for fabricating devices in core and periphery regions of a semiconductor substrate having narrow spacers while using disposable wide spacers for forming the drain and source of the device in the periphery region.

BACKGROUND OF THE INVENTION

FIG. 1 shows a cross-sectional view of a first integrated circuit device which is a flash memory cell 102 formed within a core region 104 of a semiconductor substrate 106 and of a second integrated circuit device which is a high voltage field effect transistor 108 formed within a periphery region 110 of the semiconductor substrate 106. For example, the flash memory cell 102 may be part of an array of flash memory cells formed within a core region area of the semiconductor substrate 106, and the high voltage field effect transistor 108 may be part of an integrated circuit formed within a periphery region area of the semiconductor substrate 106 for supporting operation of the array of flash memory cells. Such flash memory devices are known to one of ordinary skill in the art of memory device fabrication.

For fabricating the flash memory cell 102, a flash memory cell gate stack 112 is formed on an active area of the semiconductor substrate 106 within the core region 104. The active area of the semiconductor substrate 106 within the core region 104 is defined by the surrounding shallow trench isolation structures 122 and 124. The flash memory cell gate stack 112 includes a tunnel dielectric 114, a floating gate 116, a control dielectric 118, and a control gate 120. Such a gate stack 112 for a flash memory cell is known to one of ordinary skill in the art of memory device fabrication.

In addition, a source bit line junction 134 and a drain bit line junction 136 are formed within the core region 104 of the semiconductor substrate 106 to the sides of the flash memory cell gate stack 112. The source and drain bit line junctions 134 and 136 are typically formed from implantation of a dopant into exposed portions of the core region 104 of the semiconductor substrate 106 after formation of the flash memory cell gate stack 112. An implantation mask would be formed over the periphery region 110 during such an implantation process for forming the source and drain bit line junctions 134 and 136. Such processes for forming the source and drain bit line junctions 134 and 136 of the flash memory cell 102 are known to one of ordinary skill in the art of memory device fabrication.

For fabricating the high voltage field effect transistor 108, a transistor gate stack 128 is formed on an active area of the semiconductor substrate 106 within the periphery region 110. The active area of the semiconductor substrate 106 within the periphery region 110 is defined by the surrounding shallow trench isolation structures 124 and 126. The transistor gate stack 128 includes a gate dielectric 130 and a transistor gate 132. Such a gate stack 128 for a high voltage field effect transistor is known to one of ordinary skill in the art of memory device fabrication. The thickness of the gate dielectric 130 is typically larger such that the field effect transistor 108 has a larger threshold voltage and a higher gate break-down voltage for the high voltage field effect transistor 108 that operates with higher bias voltages such as 9 Volts for example.

Referring to FIGS. 1 and 2, a dopant is implanted into exposed regions of the periphery region 110 of the semiconductor substrate 106 for forming LDD (lightly doped drain) regions 138 and 140 to the sides of the transistor gate stack 128. An implantation mask 137 is formed over the core region 104 of the semiconductor substrate 106 such that the LDD regions 138 and 140 are formed for the high voltage field effect transistor 108. The dopant may be an N-type dopant such as arsenic or may be P-type dopant such as boron. Implantation processes for formation of such LDD regions 138 and 140 are known to one of ordinary skill in the art of integrated circuit fabrication.

Referring to FIGS. 2 and 3, after formation of the LDD regions 138 and 140 for the high voltage field effect transistor 108, first spacers 142 are formed at the sidewalls of the flash memory cell gate stack 112, and second spacers 144 are formed at the sidewalls of the transistor gate stack 128. The first and second spacers 142 and 144 are comprised of a dielectric material such as silicon dioxide ($SiO_2$) for example, and processes for formation of such spacers 142 and 144 are known to one of ordinary skill in the art of integrated circuit fabrication.

Referring to FIGS. 3 and 4, after formation of the first and second spacers 142 and 144, a dopant is implanted to form a drain junction 150 and a source junction 152 of the high voltage field effect transistor 108. An implantation mask 153 is formed over the core region 104 of the semiconductor substrate 106 such that the drain and source junctions 150 and 152 are formed for the high voltage field effect transistor 108. The dopant may be an N-type dopant such as arsenic or may be P-type dopant such as boron. Implantation processes for formation of such drain and source junctions 150 and 152 are known to one of ordinary skill in the art of integrated circuit fabrication.

Referring to FIGS. 4 and 5, a drain bit line silicide 156 is formed with the drain bit line junction 136 for providing contact to the drain bit line of the flash memory cell 102. In addition, a drain silicide 158 is formed with the drain junction 150 for providing contact to the drain of the high voltage field effect transistor, and a source silicide 160 is formed with the source junction 152 for providing contact to the source of the high voltage field effect transistor 108. Furthermore, a gate silicide 164 is formed with the transistor gate 132 for providing contact to the gate of the high voltage field effect transistor 108. Processes for forming such suicides 156, 158, 160, and 164 are known to one of ordinary skill in the art of integrated circuit fabrication.

A silicide is not shown to be formed with the source bit line junction 134 and the control gate 120 for the flash memory cell 102 in FIG. 5 because the source bit line junctions for the array of flash memory cells are coupled together and because the control gates for a row of flash memory cells are coupled together. Then, contacts are made to the coupled source bit line junctions and the coupled control gates outside of the active device area for the flash memory cell 102, as known to one of ordinary skill in the art of flash memory devices.

Referring to FIGS. 5 and 6, via structures 174, 176, 178, and 180 are formed through an inter-level dielectric layer 182 to the silicides 156, 158, 164, and 160, respectively, for providing connection between the flash memory cell 102 or the high voltage field effect transistor 108 to interconnect structures 188, 190, 192, and 194, respectively. Processes for formation of such via structures and such interconnect structures are known to one of ordinary skill in the art of integrated circuit fabrication.

Referring back to FIG. 5, the spacers 142 and 144 are formed to have a spacer width 166. Given a predetermined width of the gate stacks 112 and 128 and given the active device area for fabricating the flash memory cell 102 and the field effect transistor 108, the width 166 of the spacers 142 and 144 limits the width 168 of the drain and source silicides 156, 158, and 160. If the width 166 of the spacers 142 and 144 is wider, then less space is available for forming the drain and source suicides 156, 158, and 160.

Referring to FIG. 7, during formation of the via structure 174, the via structure 174 may be misaligned to be shifted too much to the left toward the spacer 142. In that case, a portion of the via structure 174 is formed on the spacer 142 and a portion of the via structure 174 is formed on the drain bit line silicide 156. With such misalignment, the via structure 174 does not make full contact with the drain bit line silicide 156. Such partial contact of the via structure 174 with the drain bit line silicide 156 disadvantageously results in higher resistance contact to the drain bit line of the flash memory cell 102.

FIG. 8 illustrates another flash memory cell 195 formed next to the flash memory cell 102 in an array of flash memory cells fabricated in the core region 102 in conjunction with fabrication of the flash memory cell 102, as known to one of ordinary skill in the art of flash memory devices. Typically, the two adjacent flash memory cells 102 and 195 share the common drain bit line junction 136 having the drain bit line silicide 156 and the via structure 174 formed thereon, and have separate source bit line junctions 134 that are coupled together, as known to one of ordinary skill in the art of flash memory devices. Spacers 142 are formed concurrently at the sidewalls of the flash memory cell gate stacks of the flash memory cells 102 and 195.

Referring to FIGS. 5 and 8, if the width 166 of the spacers 142 is larger, less area is available for the drain bit line silicide 156 and the via structure 174 formed between the spacers 142. Referring to FIG. 9, during formation of the via structure 174, the via structure 174 may be misaligned to be shifted too much to the left toward the spacer 142 of the left flash memory cell 102. In that case, a portion of the via structure 174 is formed on the spacer 142 of the left flash memory cell 102 and a portion of the via structure 174 is formed on the drain bit line silicide 156. Alternatively, referring to FIG. 10, the via structure 174 may be misaligned to be shifted too much to the right toward the spacer 142 of the right flash memory cell 195. In that case, a portion of the via structure 174 is formed on the spacer 142 of the right flash memory cell 195 and a portion of the via structure 174 is formed on the drain bit line silicide 156. With such misalignment, the via structure 174 does not make full contact with the drain bit line silicide 156. Such partial contact of the via structure 174 with the drain bit line silicide 156 disadvantageously results in higher resistance contact to the drain bit line of the flash memory cells 102 and 195.

Thus, a narrower width of the spacers 142 is desired for maintaining full contact of the via structure 174 with the drain bit line silicide 156 even with misalignment of the via structure 174. On the other hand, referring to FIGS. 4 and 5, with a scaled down width 166 of the spacers 142 and 144, the distance between the drain and source junctions 150 and 152 to the sidewalls of the transistor gate 132 for the high voltage field effect transistor 108 is decreased. With such decreased distance between the drain and source junctions 150 and 152 to the sidewalls of the gate structure 132 for the high voltage field effect transistor 108, the gate break-down voltage of the high voltage field effect transistor 108 undesirably decreases.

Such decreased gate break-down voltage of the high voltage field effect transistor 108 resulting from the narrower spacers 142 and 144 may render the high voltage field effect transistor 108 inoperable at high voltages such as 9 Volts for example. Nevertheless, narrower spacers 142 and 144 are desired for enhancing full contact-of the via structure 174 to the drain bit line silicide 156 even with potential misalignment during formation of the via structure 174.

Thus, a narrow width 166 of the spacers 142 and 144 is desired while maintaining a high break-down voltage of the high voltage field effect transistor 108 in the periphery region 110.

SUMMARY OF THE INVENTION

Accordingly, in a general aspect of the present invention, wide disposable spacers are used for forming the drain and source junctions of the high voltage field effect transistor in the periphery region for maintaining a high break-down voltage of such a field effect transistor. In addition, narrow permanent spacers are formed for defining the wide width of the silicides formed for the flash memory cell formed in the core region and for the high voltage field effect transistor formed in the periphery region.

In one embodiment of the present invention, for fabricating a first device within a core region of a semiconductor substrate and a second device within a periphery region of the semiconductor substrate, a first gate stack is formed on the semiconductor substrate within the core region for the first device, and a second gate stack is formed on the semiconductor substrate within the periphery region for the second device. A liner layer of a first dielectric material is deposited on any exposed surface of the semiconductor substrate, the first gate stack, and the second gate stack, and a liner layer of a second dielectric material is deposited on the liner layer of the first dielectric material.

In addition, disposable spacers comprised of the first dielectric material are formed on the liner layer of the second dielectric material at sidewalls of the first gate stack and at sidewalls of the second gate stack, and the disposable spacers are formed to have a first width; An implantation mask is patterned to remain over the core region of the semiconductor substrate. A drain junction and a source junction of the second device are formed by implanting a dopant into the periphery region of the semiconductor substrate to the sides of the disposable spacers of the second gate stack. The implantation mask is then removed from the core region of the semiconductor substrate.

Furthermore, the disposable spacers are etched away from the first gate stack and the second gate stack, and the liner layer of the second dielectric material is not etched away during etching away of the disposable spacers. Permanent spacers comprised of the second dielectric material are formed on the liner layer of the second dielectric material at sidewalls of the first gate stack and at sidewalls of the second gate stack. The permanent spacers are formed to have a second width that is less than the first width of the disposable spacers.

In an example embodiment of the present invention, the first device formed in the core region is a flash memory cell, and the first gate stack is comprised of a tunnel dielectric, a floating gate, a control dielectric, and a control gate. In addition, the second device formed in the periphery region is a high voltage field effect transistor, and the second gate stack is comprised of a gate dielectric and a transistor gate.

In this manner, the drain and source junctions of the high voltage field effect transistor formed in the periphery region are formed to be spaced wider apart with use of the wider disposable spacers. Such wider spaced drain and source junctions maintain a higher break-down voltage of the high voltage field effect transistor formed in the periphery region. Furthermore, the disposable spacers are etched away, and narrower permanent spacers are formed on the sidewalls of the gate stacks for advantageously defining a wider width of the silicides to be formed in the drain and source junctions of the devices.

These and other features and advantages of the present invention will be better understood by considering the following detailed description of the invention which is presented with the attached drawings.

BRIEF DESCRIPTION OF THE DRAWINGS

FIGS. 1, 2, 3, 4, 5, 6, and 7 show cross-sectional views for forming a flash memory cell in a core region and a high-voltage field effect transistor in a periphery region of a semiconductor substrate using narrower single spacers that undesirably decrease the break-down voltage of the field effect transistor formed in the periphery region, according to the prior art;

FIGS. 8, 9, and 10 show cross-sectional views of two adjacent flash memory cells with potential misalignment of a via structure on a drain bit line silicide formed between the two adjacent flash memory cells, according to the prior art;

FIGS. 11, 12, 13, 14, 15, 16, 17, 18, 19, 20, 21, 22, and 23 show cross-sectional views for forming a flash memory cell in a core region and a high-voltage field effect transistor in a periphery region of a semiconductor substrate using dual spacers including disposable spacers for maintaining a higher break-down voltage of the field effect transistor formed in the periphery region while forming narrower permanent spacers for the flash memory cell and the high-voltage field effect transistor, according to an embodiment of the present invention.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, 22, 23, and 24 refer to elements having similar structure and function.

Detailed Description

The present invention is described and illustrated with reference to forming a flash memory cell within a core region of a semiconductor substrate and a high-voltage field effect transistor within a periphery region of the semiconductor substrate. However, the present invention may also be practiced for forming any other types of devices within the core and periphery regions, with each device having drain and source regions formed to the sides of a gate stack.

Figure 3:
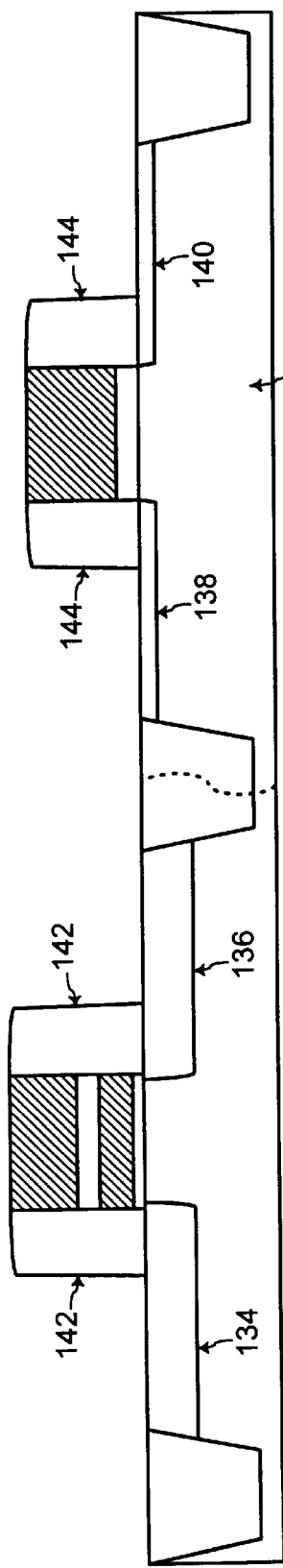
Figure 4:
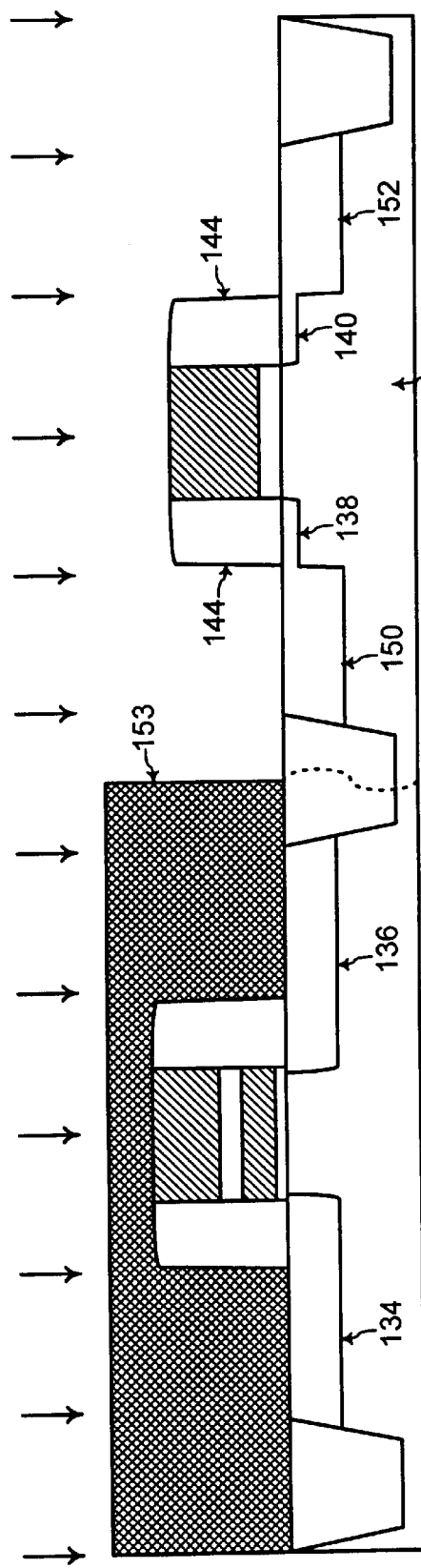
Figure 5:
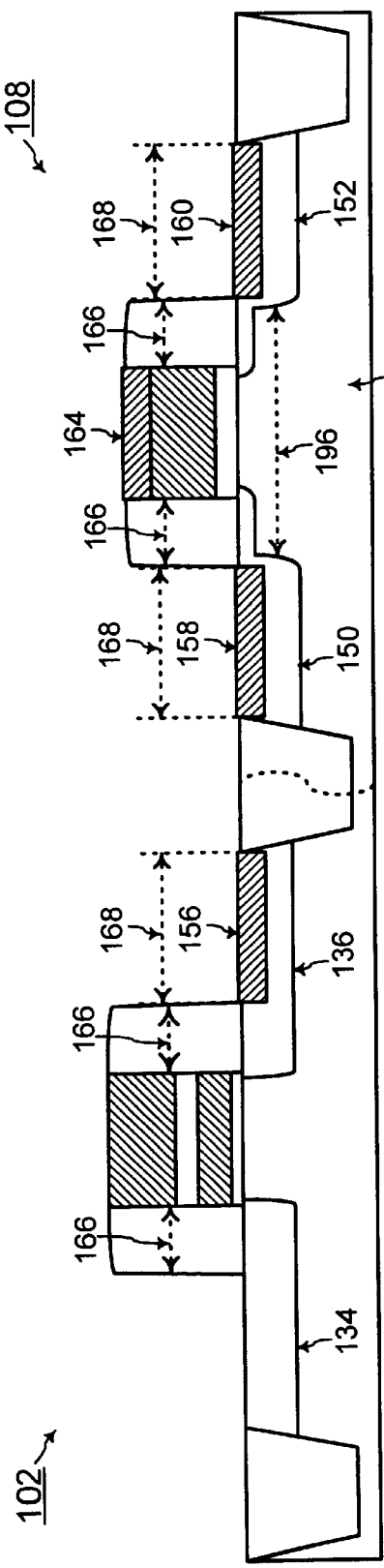
Figure 6:
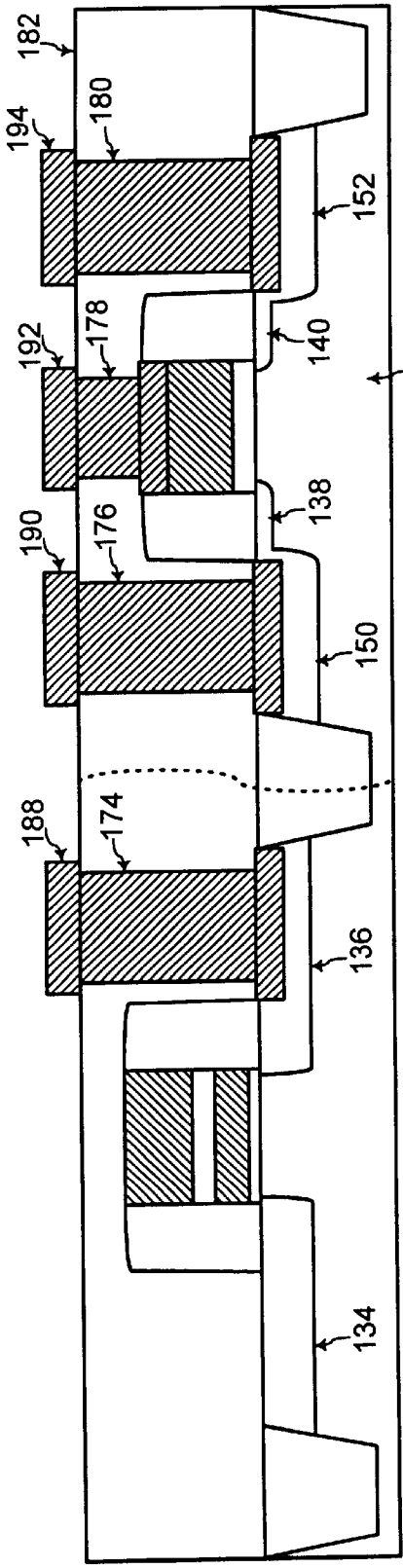
Figure 9:
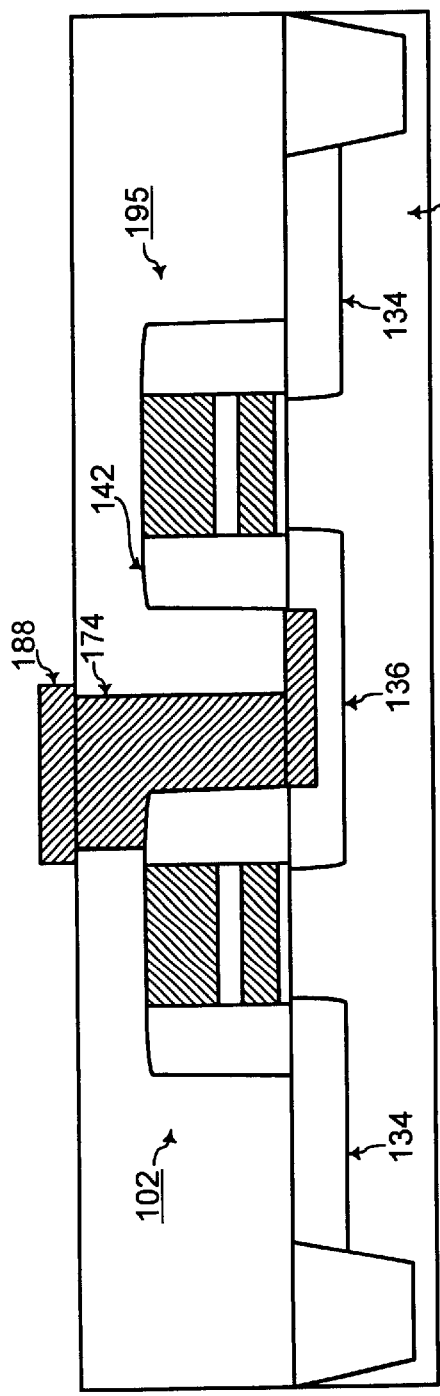
Figure 10:
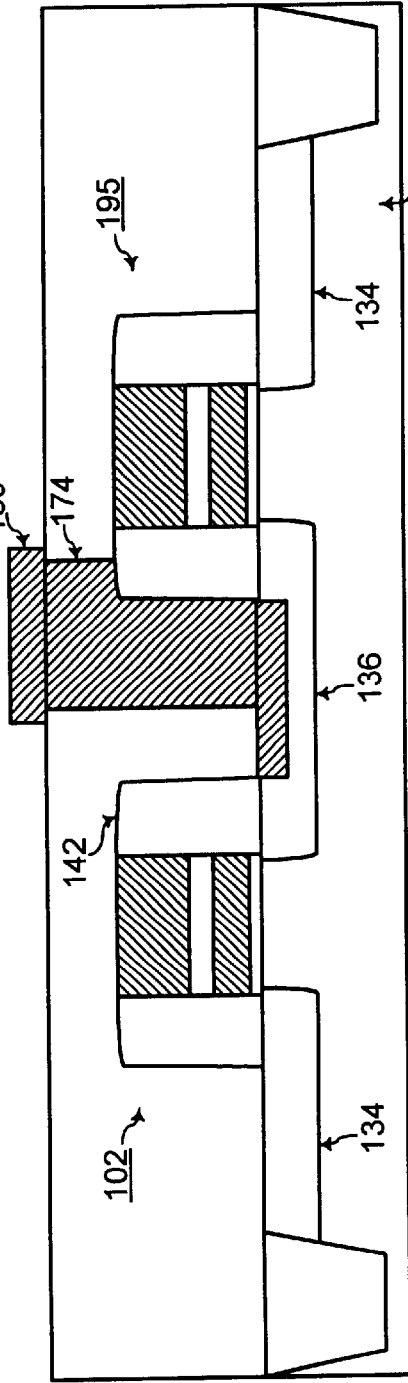
Figure 11:
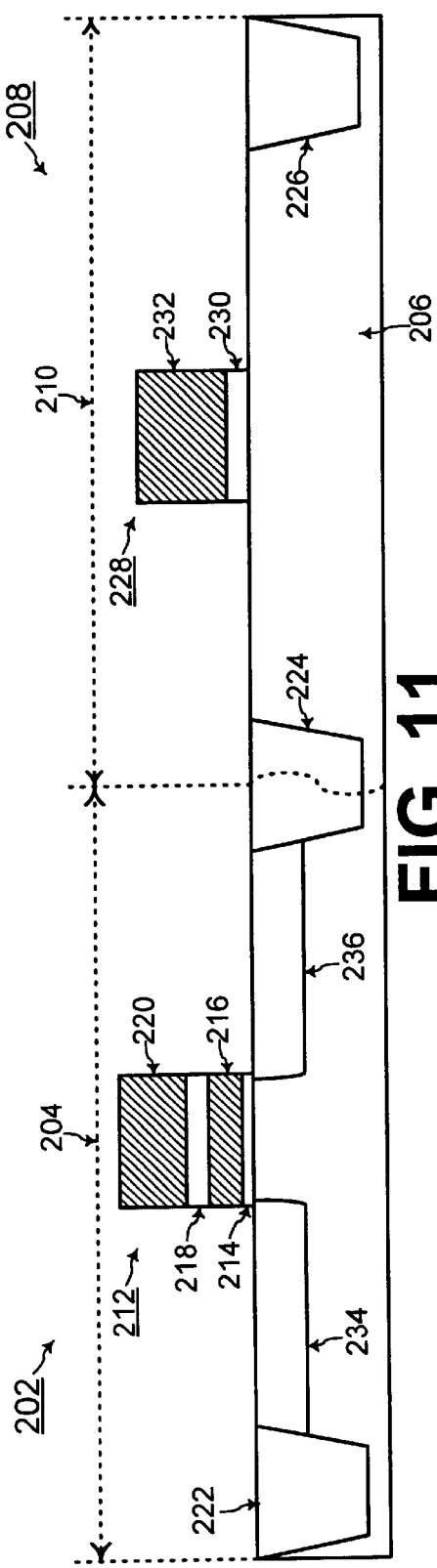

Referring to FIG. 11, a first integrated circuit device which is a flash memory cell 202 is formed within a core region 204 of a semiconductor substrate 206 which is comprised of silicon according to one embodiment of the present invention. In addition, a second integrated circuit device which is a high voltage field effect transistor 208 is formed within a periphery region 210 of the semiconductor substrate 206. For example, the flash memory cell 202 may be part of an array of flash memory cells formed within a core region area of the semiconductor substrate 206, and the high voltage field effect transistor 208 may be part of an integrated circuit formed within a periphery region area of the semiconductor substrate 206 for supporting operation of the array of flash memory cells. Such flash memory devices are known to one of ordinary skill in the art of memory device fabrication.

For fabricating the flash memory cell 202, a flash memory cell gate stack 212 is formed on an active area of the semiconductor substrate 206 within the core region 204. The active area of the semiconductor substrate 206 within the core region 204 is defined by the surrounding shallow trench isolation structures 222 and 224. The flash memory cell gate stack 212 includes a tunnel dielectric 214, a floating gate 216, a control dielectric 218, and a control gate 220. Processes for forming such a gate stack 212 for a flash memory cell are known to one of ordinary skill in the art of memory device fabrication.

In addition, a source bit line junction 234 and a drain bit line junction 236 are formed within the core region 204 of the semiconductor substrate 206 to the sides of the flash memory cell gate stack 212. The source and drain bit line junctions 234 and 236 are typically formed from implantation of a dopant into exposed portions of the core region 204 of the semiconductor substrate 206 after formation of the flash memory cell gate stack 212. An implantation mask would be formed over the periphery region 210 during such an implantation process for forming the source and drain bit line junctions 234 and 236. Such processes for forming the source and drain bit line junctions 234 and 236 of the flash memory cell 202 are known to one of ordinary skill in the art of memory device fabrication.

For fabricating the high voltage field effect transistor 208, a transistor gate stack 228 is formed on an active area of the semiconductor substrate 206 within the periphery region 210. The active area of the semiconductor substrate 206 within the periphery region 210 is defined by the surrounding shallow trench isolation structures 224 and 226.

Processes for formation of shallow trench isolation structures are known to one of ordinary skill in the art of integrated circuit fabrication. The dashed line through the middle shallow trench isolation structure 224 and the semiconductor substrate 206 indicates that the core region 204 and the periphery region 210 illustrated in FIG. 6 may be separated by a larger area of integrated circuit devices formed there-between. However, the core region 204 and the periphery region 210 are illustrated adjacent to each-other in FIG. 6 for ease of illustration.

The transistor gate stack 228 for the high-voltage field effect transistor 208 includes a gate dielectric 230 and a transistor gate 232. Such a gate stack 228 for a high voltage field effect transistor is known to one of ordinary skill in the art of memory device fabrication. The thickness of the gate dielectric 230 is typically larger such that the field effect transistor 208 has a larger threshold voltage and a higher gate break-down voltage for the high voltage field effect transistor 208 that operates with higher bias voltages such as 9 Volts for example.

Figure 12:
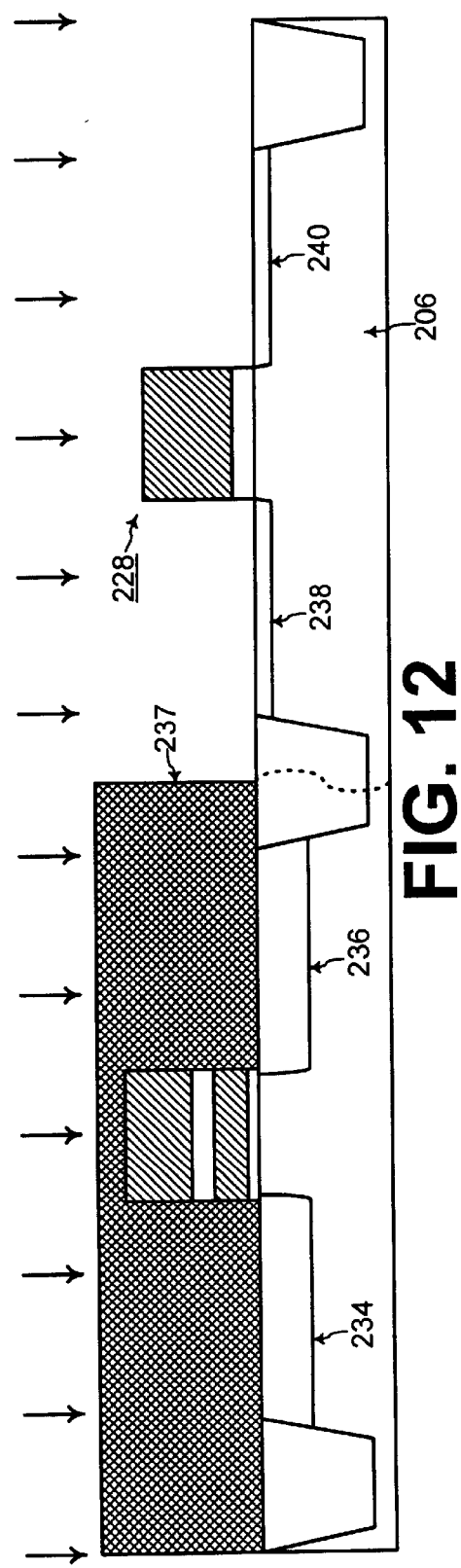

Referring to FIGS. 11 and 12, after formation of the gate stacks 212 and 228, a dopant is implanted into exposed regions of the periphery region 210 of the semiconductor substrate 206 for forming LDD (lightly doped drain) regions 238 and 240 to the sides of the transistor gate stack 228. An implantation mask 237 is formed over the core region 204 of the semiconductor substrate 206 such that the LDD regions 238 and 240 are formed for the high voltage field effect transistor 208. The dopant may be an N-type dopant such as arsenic or may be P-type dopant such as boron. Implantation processes for formation of such LDD regions 238 and 240 are known to one of ordinary skill in the art of integrated circuit fabrication.

Figure 13:
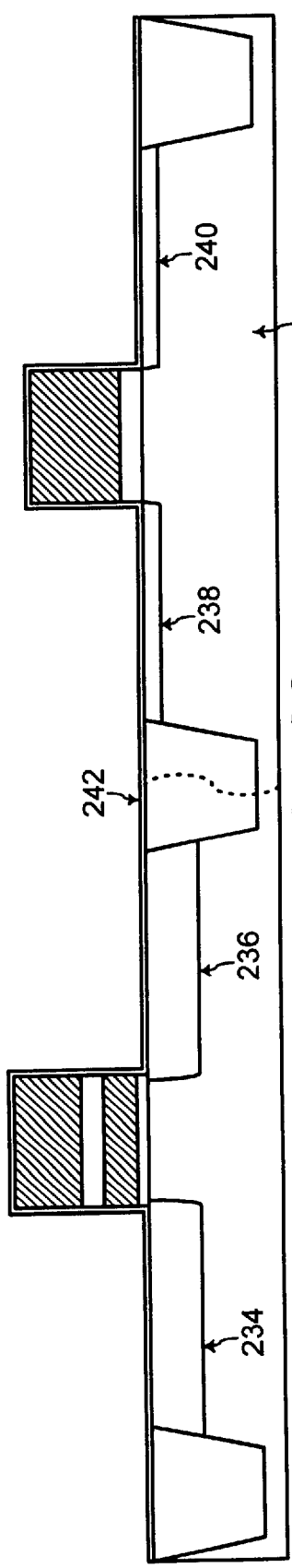

Referring to FIGS. 12 and 13, after formation of the LDD regions 238 and 240, a liner layer of silicon dioxide ($SiO_2$) 242 is conformally deposited on any exposed surfaces including the exposed surfaces of the semiconductor substrate 206, the flash memory cell gate stack 212, and the transistor gate stack 228. Processes for conformal deposition of the liner layer of silicon dioxide ($SiO_2$) 242 are known to one of ordinary skill in the art of integrated circuit fabrication.

Figure 14:
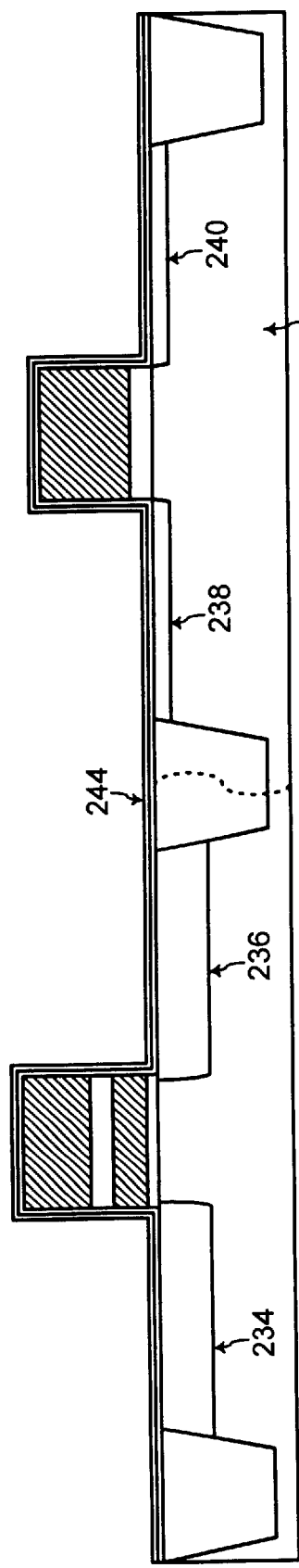

Referring to FIGS. 13 and 14, after deposition of the liner layer of silicon dioxide ($SiO_2$) 242, a liner layer of silicon nitride ($Si_XN_Y$) 244 is conformally deposited on the liner layer of silicon dioxide ($SiO_2$) 242. The "X" and the "Y" in ($Si_XN_Y$) are any integers for known compositions of silicon nitride ($Si_XN_Y$). Processes for conformal deposition of the liner layer of silicon nitride ($Si_XN_Y$) 244 on the liner layer of silicon dioxide ($SiO_2$) 242 are known to one of ordinary skill in the art of integrated circuit fabrication.

Referring to FIGS. 14 and 15, after deposition of the liner layer of silicon nitride ($Si_XN_Y$) 244, a blanket layer of silicon dioxide ($SiO_2$) 246 is deposited on the liner layer of silicon nitride ($Si_XN_Y$) 244. The thickness of the blanket layer of silicon dioxide ($SiO_2$) 246 is large enough to extend above the total height of the gate stacks 212 and 228. Processes for deposition of the blanket layer of silicon dioxide ($SiO_2$) 246 are known to one of ordinary skill in the art of integrated circuit fabrication.

Referring to FIGS. 15 and 16, an anisotropic etch process is performed for etching away portions of the blanket layer of silicon dioxide ($SiO_2$) 246 such that the remaining portions of the silicon dioxide ($SiO_2$) form disposable spacers at the sidewalls of the gate stacks 212 and 228. Thus, first disposable spacers 248 are formed on the liner layer of silicon nitride ($Si_XN_Y$) 244 at the sidewalls of the flash memory cell gate stack 212, and second disposable spacers 250 are formed on the liner layer of silicon nitride ($Si_XN_Y$) 244 at the sidewalls of the transistor gate stack 228.

The first and second disposable spacers 248 and 250 comprised of silicon dioxide ($SiO_2$) are formed to have a first width 252. In addition, the first and second disposable spacers 248 and 250 are formed in an anisotropic etch process for selectively etching silicon dioxide ($SiO_2$). The liner layer of silicon nitride ($Si_XN_Y$) 244 acts as an etch stop layer during the anisotropic etching of the blanket layer of silicon dioxide ($SiO_2$) 246 for forming the disposable spacers 248 and 250. Anisotropic etch processes for forming the first and second disposable spacers 248 and 250 are individually known to one of ordinary skill in the art of integrated circuit fabrication.

Referring to FIGS. 16 and 17, after formation of the disposable spacers 248 and 250, an implantation mask 254 is patterned to remain over the core region 204. Further referring to FIG. 17, a dopant is implanted into regions of the active device area in the periphery region 210 to the sides of the disposable spacers 250 of the transistor gate stack 228 for forming a drain junction 256 and a source junction 258 of the high-voltage field effect transistor. The dopant may be an N-type dopant such as arsenic or may be P-type dopant such as boron. Implantation processes for formation of such drain and source junctions 256 and 258 are known to one of ordinary skill in the art of integrated circuit fabrication.

Further referring to FIG. 17, the implantation mask 254 is comprised of a material that prevents implantation of the dopant into the active device area of the core region 204. Such implantation materials and processes for patterning such implantation materials are known to one of ordinary skill in the art of integrated circuit fabrication. In addition, because the drain and source junctions 256 and 258 of the high-voltage field effect transistor 208 formed in the periphery region 210 are formed with the disposable spacers 250, the width 252 of the disposable spacers 250 determines the distance of the drain and source junctions 256 and 258 from the sidewalls of the gate stack 228 of the high voltage field effect transistor 208.

Referring to FIGS. 17 and 18, after formation of the drain and source junctions 256 and 258 for the high-voltage field effect transistor 208 in the periphery region 210, the implantation mask 254 is stripped away from the core region 204. Processes for stripping away the implantation mask 254 are known to one of ordinary skill in the art of integrated circuit fabrication. Further referring to FIG. 18, the disposable spacers 248 and 250 are etched away after formation of the drain and source junctions 256 and 258 for the high-voltage field effect transistor 208 in the periphery region 210.

Processes for etching away the disposable spacers 248 and 250 comprised of silicon dioxide ($SiO_2$) are known to one of ordinary skill in the art of integrated circuit fabrication. Further referring to FIG. 18, the disposable spacers 248 and 250 are etched away in an etch process for selectively etching away silicon dioxide ($SiO_2$). Thus, the liner layer of silicon nitride ($Si_XN_Y$) 244 acts as an etch stop layer during etching of the silicon dioxide ($SiO_2$) spacers 248 and 250.

Referring to FIGS. 18 and 19, a blanket layer of silicon nitride ($Si_XN_Y$) 262 is deposited on the liner layer of silicon nitride ($Si_XN_Y$) 244. The thickness of the blanket layer of silicon nitride ($Si_XN_Y$) 262 is large enough to extend above the total height of the gate stacks 212 and 228. Processes for deposition of the blanket layer of silicon nitride ($Si_XN_Y$) 262 are known to one of ordinary skill in the art of integrated circuit fabrication.

Referring to FIGS. 19 and 20, an anisotropic etch process is performed for etching away portions of the blanket layer of silicon nitride ($Si_XN_Y$) 262 such that the remaining portions of the silicon nitride ($Si_XN_Y$) form permanent spacers at the sidewalls of the gate stacks 212 and 228. Thus, first permanent spacers 264 are formed on the liner layer of silicon nitride ($Si_XN_Y$) 244 at the sidewalls of the flash memory cell gate stack 212, and second permanent spacers 266 are formed on the liner layer of silicon nitride ($Si_XN_Y$) 244 at the sidewalls of the transistor gate stack 228.

Referring to FIGS. 16 and 20, the first and second permanent spacers 264 and 266 comprised of silicon nitride ($Si_XN_Y$) are formed to have a second width 268 that is less than the first width 252 of the first and second disposable spacers 248 and 250. In addition, because the first and second permanent spacers 264 and 266 are formed in an anisotropic etch process for etching silicon nitride ($Si_XN_Y$), the exposed portions of the liner layer of silicon nitride ($Si_XN_Y$) 244 are etched away in such an anisotropic etch process as illustrated in FIG. 20. Anisotropic etch processes for forming the first and second permanent spacers 264 and 266 from the blanket layer of silicon nitride ($Si_XN_Y$) 262 are individually known to one of ordinary skill in the art of integrated circuit fabrication.

Referring to FIGS. 20 and 21, a thermal anneal process is performed for activating dopant within the drain and source junctions 256 and 258 of the field effect transistor 208 within the periphery region 210 and the dopant within the drain and source bit line junctions 234 and 236 of the flash memory cell 202 within the core region 204. Thermal anneal processes for activating dopant are known to one of ordinary skill in the art of integrated circuit fabrication.

Referring to FIGS. 21 and 22, a drain bit line silicide 278 is formed with the drain bit line junction 236 for providing contact to the drain bit line of the flash memory cell 202. In addition, a drain silicide 280 is formed with the drain junction 256 for providing contact to the drain of the high voltage field effect transistor 208, and a source silicide 282 is formed with the source junction 258 for providing contact to the source of the high voltage field effect transistor 208. The drain and source suicides 278, 280, and 282 are formed to have a width 288 limited by the width 268 of the permanent spacers 264 and 266. Furthermore, a gate silicide 286 is formed with the transistor gate 232 for providing contact to the gate of the high voltage field effect transistor 208. Processes for forming such silicides 278, 280, 282, and 286 are known to one of ordinary skill in the art of integrated circuit fabrication.

A silicide is not shown to be formed with the source bit line junction 234 and the control gate 220 for the flash memory cell 202 in FIG. 22 because the source bit line junctions for the array of flash memory cells are coupled together and because the control gates for a row of flash memory cells are coupled together. Then, contacts are made to the coupled source bit line junctions and the coupled control gates outside of the active device area for the flash memory cell 202, as known to one of ordinary skill in the art of flash memory devices.

Figure 23:
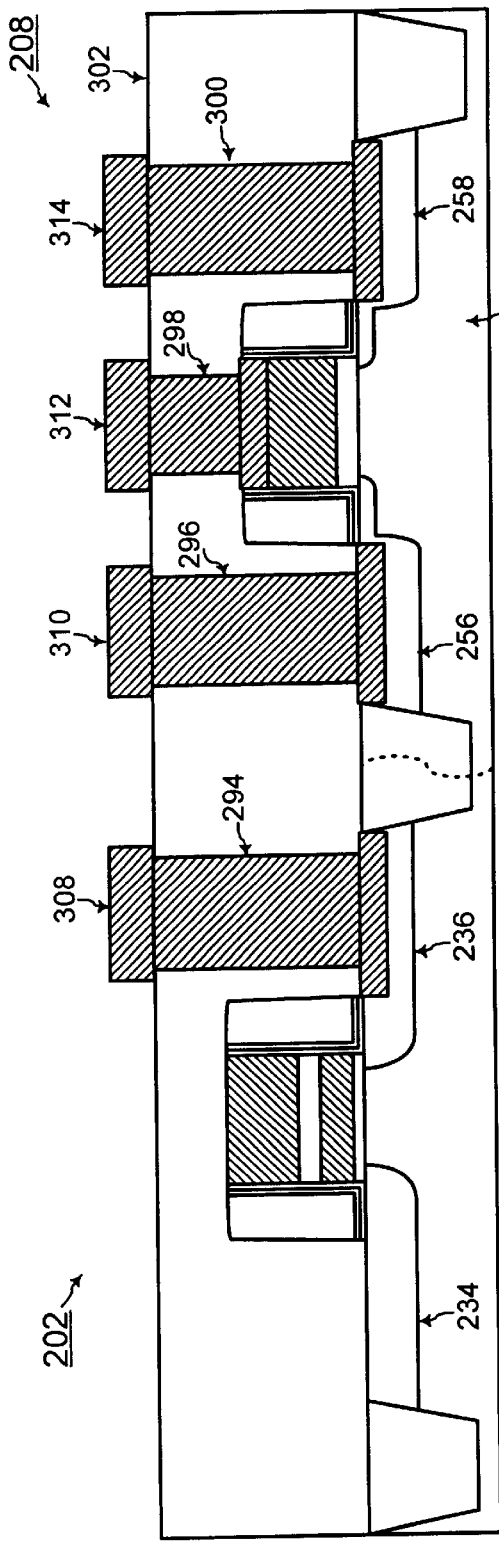

Referring to FIGS. 22 and 23, via structures 294, 296, 298, and 300 are formed through an inter-level dielectric layer 302 to the silicides 278, 280, 286, and 282, respectively, for providing connection between the flash memory cell 202 or the high voltage field effect transistor 208 to interconnect structures 308, 310, 312, and 314, respectively. Processes for formation of such via structures and such interconnect structures are known to one of ordinary skill in the art of integrated circuit fabrication.

In this manner, referring to FIGS. 17 and 23, because the drain and source junctions 256 and 258 of the high voltage field effect transistor 208 formed in the periphery region 210 are formed with the wider disposable spacers 250, the distance of the drain and source junctions 256 and 258 from the sides of the transistor gate 232 is larger than if the narrower permanent spacers 266 were used. Such larger distance of the drain and source junctions 256 and 258 from the sides of the transistor gate 232 advantageously results in a higher gate break-down voltage of the high voltage field effect transistor 208.

Figure 24:
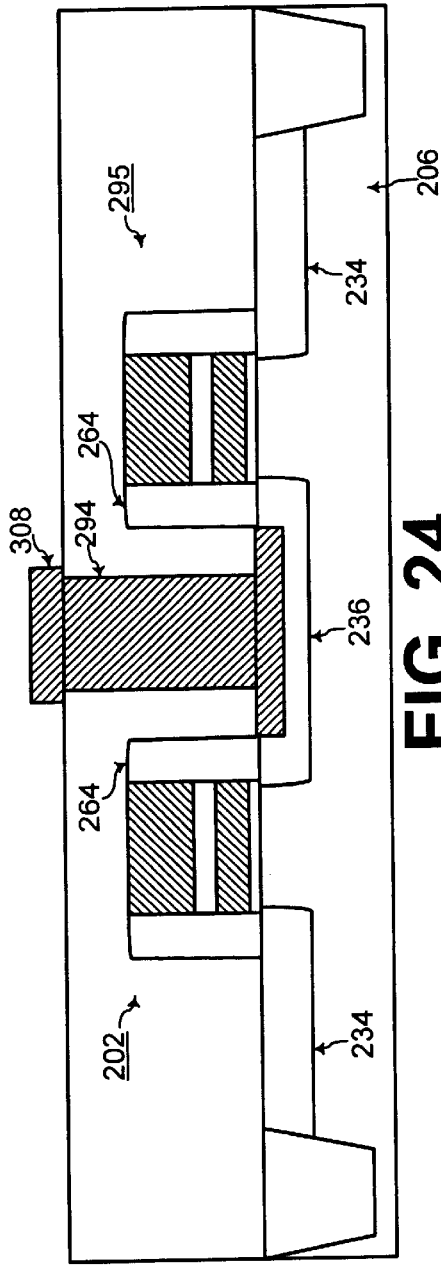
FIG. 24 shows a cross-sectional view of two adjacent flash memory cells formed with the narrower spacers of FIG. 20 allowing a wider margin of misalignment for a via structure formed on a drain bit line silicide between the two adjacent flash memory cells, according to an embodiment of the present invention.

At the same time, after formation of the drain and source junctions 256 and 258 of the high voltage field effect transistor 208, the wider disposable spacers 248 and 250 are etched way to form narrower permanent spacers 264 and 266. Referring to FIGS. 23 and 24, the narrower permanent spacers 264 and 266 advantageously allow a larger margin for misalignment during formation of the via structure 294.

FIG. 24 illustrates another flash memory cell 295 formed next to the flash memory cell 202 in an array of flash memory cells fabricated in the core region 202. The adjacent flash memory cell 295 would be formed in conjunction with formation of an array of flash memory cells similar to the flash memory cell 202. Processes for such formation of an array of flash memory cells would be known to one of ordinary skill in the art of flash memory devices from the description herein. Typically, the two adjacent flash memory cells 202 and 295 share the common drain bit line junction 236 having the drain bit line silicide 278 and the via structure 294 formed thereon, and have separate source bit line junctions 234 that are coupled together, as known to one of ordinary skill in the art of flash memory devices.

Permanent spacers 264 are formed concurrently at the sidewalls of the flash memory cell gate stacks of the flash memory cells 202 and 295. Referring to FIGS. 23 and 24, with formation of the narrower permanent spacers 264 and 266, the via structure 294 may be misaligned toward the left or right with a larger misalignment and yet still make full contact with the drain bit line silicide 278.

The foregoing is by way of example only and is not intended to be limiting. For example, any specified material or any specified dimension of any structure described herein is by way of example only. In addition, the present invention is described and illustrated with reference to forming the flash memory cell 202 within the core region 204 of the semiconductor substrate 206 and the high-voltage field effect transistor 208 within the periphery region 210 of the semiconductor substrate 206. However, the present invention may also be practiced for forming any other types of devices within the core and periphery regions, with each device having drain and source regions formed to the sides of a gate stack.

In addition, as will be understood by those skilled in the art, the structures described herein may be made or used in the same way regardless of their position and orientation. Thus, it is to be understood that terms and phrases such as "on" and "side" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method of fabricating a first device within a core region and a second device within a periphery region, of a semiconductor substrate, including the steps of:

forming disposable spacers having a first width at sidewalls of a first gate stack of the core region and a second gate stack of the periphery region;

forming drain and source junctions in the periphery region to the sides of the disposable spacers of the second gate stack; and removing the disposable spacers and forming permanent spacers having a second width at the sidewalls of the first and second gate stacks, wherein the second width is less than the first width;

and wherein a plurality of liner layers of dielectric materials are formed on surfaces of the gate stacks and the substrate before formation of permanent spacers;

and wherein at least one liner layer of the dielectric materials remains to cover any surfaces of the gate stacks and the substrate not under the permanent spacers in the core and periphery regions after formation of the permanent spacers.

2. The method of claim 1, further including the steps of:

forming drain and source bit line junctions to sides of the first gate stack within the core region before forming the disposable spacers; and forming lightly doped source and drain regions to sides of the second gate stack within the periphery region before forming the disposable spacers.

3. The method of claim 2, further including the step of:

forming silicide with an exposed portion of the drain bit line junction within the core region after forming the permanent spacers.

4. The method of claim 1, wherein the first device is a flash memory cell, and wherein the first gate stack is comprised of a tunnel dielectric, a floating gate, a control dielectric, and a control gate.

5. The method of claim 1, wherein the second device is a high voltage field effect transistor, and wherein the second gate stack is comprised of a gate dielectric and a transistor gate.

6. The method of claim 1, wherein the disposable spacers are comprised of silicon dioxide ($SiO_2$).

7. The method of claim 6, wherein the permanent spacers are comprised of silicon nitride ($Si_xN_y$).

8. A method of fabricating a first device within a core region and a second device within a periphery region, of a semiconductor substrate, including the steps of:
   forming a first gate stack in the core region and a second gate stack in the periphery region;
   depositing a liner layer of a first dielectric material on exposed surfaces of the first and second gate stacks;
   depositing a liner layer of a second dielectric material on the liner layer of the first dielectric material;
   forming disposable spacers having a first width and comprised of the first dielectric material on the liner layer of the second dielectric material at sidewalls of the first and second gate stacks;
   forming drain and source junctions in the periphery region to the sides of the disposable spacers;
   etching away the disposable spacers, wherein the liner layer of the second dielectric material is not etched away; and
   forming permanent spacers having a second width and comprised of the second dielectric material on the liner layer of the second dielectric material at sidewalls of the first and second gate stacks, wherein the second width is less than the first width.

9. The method of claim 8, wherein a portion of the liner layer of the second dielectric material not covered by the permanent spacers is etched away during formation of the permanent spacers.

10. The method of claim 9, wherein a blanket layer of the second dielectric material is conformally deposited and anisotropically etched away to form the permanent spacers.

11. The method of claim 8, further including the steps of:
   forming drain and source bit line junctions to sides of the first gate stack within the core region before forming the disposable spacers; and
   forming lightly doped source and drain regions to sides of the second gate stack within the periphery region before forming the disposable spacers.

12. The method of claim 11, further including the steps of:
   forming silicide with an exposed portion of the drain bit line junction after the forming the permanent spacers.

13. The method of claim 8, wherein the first device is a flash memory cell, and wherein the first gate stack is comprised of a tunnel dielectric, a floating gate, a control dielectric, and a control gate.

14. The method of claim 8, wherein the second device is a high voltage field effect transistor, and wherein the second gate stack is comprised of a gate dielectric and a transistor gate.

15. The method of claim 8, wherein the liner layer of the first dielectric material and the disposable spacers are comprised of silicon dioxide ($SiO_2$).

16. The method of claim 15, wherein the liner layer of the second dielectric material and the permanent spacers are comprised of silicon nitride ($Si_xN_y$).

17. A method for fabricating a flash memory cell within a core region of a semiconductor substrate and a high voltage field effect transistor within a periphery region of the semiconductor substrate, the method including the steps of:

(A) forming a first gate stack on the semiconductor substrate within the core region for the flash memory cell, wherein the first gate stack includes a tunnel dielectric, a floating gate, a control dielectric, and a control gate of the flash memory cell;

and wherein drain and source bit line junctions of the flash memory cell are formed within the core region of the semiconductor substrate to sides of the first gate stack;

(B) forming a second gate stack on the semiconductor substrate within the periphery region for the high voltage field effect transistor, wherein the second gate stack includes a gate dielectric and a transistor gate for the high voltage field effect transistor;

(C) implanting a dopant into exposed portions of the periphery region for forming lightly doped source and drain regions around the second gate stack for the high voltage field effect transistor;

(D) depositing a liner layer of a first dielectric material on any exposed surface of the semiconductor substrate, the first gate stack, and the second gate stack, wherein the first dielectric material is silicon dioxide ($SiO_2$);

(E) depositing a liner layer of a second dielectric material on the liner layer of the first dielectric material, wherein the second dielectric material is silicon nitride ($Si_xN_y$);

(F) forming disposable spacers comprised of silicon dioxide ($SiO_2$) on the liner layer of the second dielectric material at sidewalls of the first gate stack and at sidewalls of the second gate stack, wherein the disposable spacers are formed to have a first width;

(G) patterning an implantation mask to remain over the core region of the semiconductor substrate;

(H) forming a drain junction and a source junction of the high voltage field effect transistor by implanting a dopant into the periphery region of the semiconductor substrate to the sides of the disposable spacers of the second gate stack;

(I) removing the implantation mask from the core region of the semiconductor substrate;

(J) etching away the disposable spacers from the first gate stack and the second gate stack, wherein the liner layer of the second dielectric material comprised of silicon nitride ($Si_xN_y$) is not etched away during etching away of the disposable spacers comprised of silicon dioxide ($SiO_2$);

(K) forming permanent spacers comprised of silicon nitride ($Si_xN_y$) on the liner layer of the second dielectric material at sidewalls of the first gate stack and at sidewalls of the second gate stack by conformally depositing a blanket layer of the second dielectric material and then anisotropically etching away the blanket layer of the second dielectric material to form the permanent spacers, wherein any portion of the liner layer of the second dielectric material not covered by the permanent spacers is etched away during formation of the permanent spacers;

and wherein the permanent spacers are formed to have a second width that is less than the first width of the disposable spacers; and (L) forming silicides with exposed portions of the drain bit line junction of the flash memory cell and the drain and source junctions of the high voltage field effect transistor.

* * * * *